United States Patent
Taya et al.

(10) Patent No.: US 9,315,692 B2
(45) Date of Patent: Apr. 19, 2016

(54) BASE MATERIAL FILM FOR DICING SHEET AND DICING SHEET

(75) Inventors: Naoki Taya, Tokyo (JP); Takashi Morioka, Tokyo (JP)

(73) Assignee: LINTEC CORPORATION, Tokyo (JP)

( * ) Notice: Subject to any disclaimer, the term of this patent is extended or adjusted under 35 U.S.C. 154(b) by 170 days.

(21) Appl. No.: 13/637,099

(22) PCT Filed: Mar. 24, 2011

(86) PCT No.: PCT/JP2011/057116
§ 371 (c)(1),
(2), (4) Date: Oct. 19, 2012

(87) PCT Pub. No.: WO2011/122428
PCT Pub. Date: Oct. 6, 2011

(65) Prior Publication Data
US 2013/0034729 A1    Feb. 7, 2013

(30) Foreign Application Priority Data

Mar. 31, 2010  (JP) .................................. 2010-081682

(51) Int. Cl.
*B32B 27/38*   (2006.01)
*C09J 7/02*    (2006.01)
*H01L 21/683*  (2006.01)

(52) U.S. Cl.
CPC .............. *C09J 7/0267* (2013.01); *C09J 7/0296* (2013.01); *H01L 21/6836* (2013.01); *C09J 2201/162* (2013.01); *C09J 2203/326* (2013.01); *C09J 2205/114* (2013.01); *C09J 2423/046* (2013.01); *C09J 2433/006* (2013.01);

(Continued)

(58) Field of Classification Search
None
See application file for complete search history.

(56) References Cited

U.S. PATENT DOCUMENTS

| 4,829,124 A | * | 5/1989 | Clark | ............................. 525/108 |
| 5,187,007 A | * | 2/1993 | Ebe et al. | ...................... 428/343 |
| 5,356,949 A | | 10/1994 | Komiyama | |

(Continued)

FOREIGN PATENT DOCUMENTS

| CN | 1865375 A | 11/2006 |
| JP | 05-211234 A | 8/1993 |

(Continued)

OTHER PUBLICATIONS

Machine translation of KR 20060117221A (2006).*

(Continued)

*Primary Examiner* — Alexandre Ferre
(74) *Attorney, Agent, or Firm* — Posz Law Group, PLC

(57) ABSTRACT

A base material film used for a dicing sheet, the dicing sheet including the base material film and a pressure-sensitive adhesive layer laminated on one surface of the base material film. The base material film includes a single layer of resin film or multiple layers of resin films, at least the resin film in contact with the pressure-sensitive adhesive layer being formed from a resin composition containing ethylene-(meth) acrylic acid copolymer as a main constituent, the resin composition further containing 0.3 to 17.0 parts by mass of an epoxy compound based on 100 parts by mass of the ethylene-(meth)acrylic acid copolymer. The dicing sheet that uses the base material film does not require application of physical energy such as an electron beam or a γ-ray, and can be reduced in dicing dust that is generated during the dicing of a cut object.

20 Claims, 1 Drawing Sheet

(52) U.S. Cl.
CPC ....... *C09J 2463/006* (2013.01); *Y10T 428/287* (2015.01); *Y10T 428/2848* (2015.01)

(56) References Cited

U.S. PATENT DOCUMENTS

| | | | | |
|---|---|---|---|---|
| 5,882,956 | A * | 3/1999 | Umehara | H01L 21/304 257/E21.237 |
| 7,141,300 | B2 * | 11/2006 | Yamamoto et al. | 428/343 |
| 2003/0139507 | A1 * | 7/2003 | Teramoto et al. | 524/373 |

FOREIGN PATENT DOCUMENTS

| | | | | |
|---|---|---|---|---|
| JP | 08059902 | A | * | 3/1996 |
| JP | 2002-235061 | A | | 8/2002 |
| JP | 2002343747 | A | * | 11/2002 |
| JP | 2005-033059 | A | | 2/2005 |
| JP | 2007-088240 | A | | 4/2007 |
| JP | 2008-135448 | A | | 6/2008 |
| JP | 2009-030043 | A | | 2/2009 |
| JP | 2009-206310 | A | | 9/2009 |
| JP | 2010-016034 | A | | 1/2010 |
| KR | 1995-0009551 | B1 | | 8/1995 |
| KR | 20060117221 | A | * | 11/2006 |

OTHER PUBLICATIONS

Machine translation JP08-059902. (1996).*
Machine translation JP2002-343747. (2002).*
An Office Action dated Dec. 12, 2013 for the corresponding Korean application No. 10-2012-7026577.
Office Action dated Sep. 23, 2014 issued in corresponding CN patent application No. 201180017317.0.
Office Action mailed May 14, 2014 issued in corresponding JP patent application No. 2012-508241.
Ichiro Ogura, "Relation between Chemical Structures and Characteristics on Epoxy Resins," DIC Technical Review, 2001, No. 7, pp. 1-12, Japan (and English translation of relevant portion of the reference).
Kozo Matsumoto et al., "Synthesis of Cross-linked Poly (γ-glutamic acid) s by Using a Water-soluble Difunctional Epoxy Compound," Molecular Engineering Institute, 2009, vol. 30, No. 3, Japan (and English translation of relevant portion of the reference).
Office Action dated Sep. 22, 2014 issued in corresponding TW patent application No. 100110734.
The International Search Report of the International Searching Authority mailed May 10, 2011 for the corresponding international application No. PCT/JP2011/057116 (with English translation).

* cited by examiner

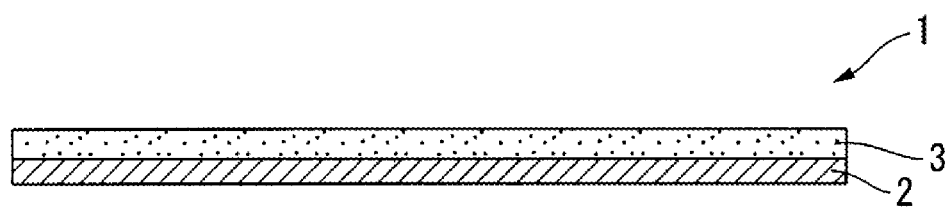

BASE MATERIAL FILM FOR DICING SHEET AND DICING SHEET

CROSS REFERENCE TO RELATED APPLICATIONS

This application is a U.S. national stage application of PCT/JP2011/057116 filed on Mar. 24, 2011, and claims priority to, and incorporates by reference, Japanese Patent Application No. 2010-081682 filed on Mar. 31, 2010.

TECHNICAL FIELD

The present invention relates to a dicing sheet to which a cut object such as a semiconductor wafer is applied when the cut object is cut and separated into small element pieces and relates also to a base material film used for the dicing sheet.

BACKGROUND ART

Semiconductor wafers such as silicon and gallium arsenide wafers and various types of packages (which may be collectively referred to as "cut object(s)" herein) are manufactured with a large diameter, and these are cut and separated (diced) into small element pieces (referred to as "chips" hereinafter) before being transferred to a mounting process as the subsequent process. At that time, the cut objects such as semiconductor wafers are preliminarily applied to a pressure-sensitive adhesive sheet to be supplied to various processes including dicing, washing, drying, expanding, picking-up, and mounting.

Heretofore, during processes from the dicing process for cut objects to the picking-up process, a dicing sheet has been used which is comprised of a base material film and a pressure-sensitive adhesive layer formed thereon. In such a dicing sheet, a polyolefin based film, a polyvinyl chloride based film or the like is typically used as the base material film.

At the time of dicing, however, a part of the pressure-sensitive adhesive layer or the base material film may also be cut with each cut object, and dicing dust may arise from the dicing sheet thereby to contaminate chips to be obtained.

One of methods for performing dicing is a full cut dicing, in which a rotating round blade fully cuts the cut object such as a semiconductor wafer while possibly cutting a part of the pressure-sensitive adhesive layer or the base material film of the dicing sheet. At that time, a part of the base material film may be molten due to heat caused by friction with the rotating round blade and elongated to generate string-like dust on a dicing line. Further, such string-like dust still remains with pressure-sensitive adhesive.

If each chip is sealed in a package while being attached thereto with a large amount of the above-described string-like dust, then the string-like dust will be decomposed by heat used for the enclosing thereby to destroy the package or cause operational failure in a device to be obtained. String-like dust with pressure sensitive adhesive is difficult to be removed by washing, and the yield will thus be significantly reduced. Therefore, when performing dicing by using a dicing sheet, it is required to prevent such string-like dicing dust from being generated.

Further, when dicing a package sealed with cured resin as a cut object, dicing is performed using a thicker dicing blade with a deeper cutting depth than the case of dicing a semiconductor wafer. Thus, in such dicing for a package as a cut object, considerable amount of string-like dicing dust may be generated because the amount of the base material film to be cut is large.

To this end, Patent Document 1 discloses an invention which uses as a base material film of a dicing sheet a polyolefin based film having been irradiated to electron beam or γ (gamma) ray with 1 to 80 Mrad. In that invention, resin as a constituent of the base material film appears to be cross-linked through the irradiation to electron beam or γ ray thereby to suppress the dicing dust from being generated.

Patent Document 1 illustrates, as materials for the polyolefin based film to be irradiated to electron beam or γ ray, resins such as polyethylene, polypropylene, polymethylpentene, ethylene-vinyl acetate copolymer, ethylene-(meth)acrylic acid copolymer, ethylene-methyl(meth)acrylate copolymer, ethylene-ethyl(meth)acrylic acid copolymer, ethylene-ionomer copolymer, ethylene-vinyl alcohol copolymer, and polybutene.

PRIOR ART DOCUMENT(S)

Patent Document(s)

[Patent Document 1] Published Patent Application No. H5-211234

SUMMARY OF THE INVENTION

Problem to be Solved by the Invention

However, resins as described above may be deteriorated in their elasticity and strength due to the irradiation to electron beam or γ ray. That is, the irradiation to electron beam or γ ray may have to be performed with a certain radiation dose or more in order to prevent the generation of string-like dicing dust, while the cross-linkage caused by the irradiation unduly progresses the curing of resins to reduce the elasticity, and resins may become brittle. If the elasticity and strength of the base material film are reduced in such a manner, then the expanding ratio (expandability) of the sheet will also be reduced in the expanding process to be performed after the dicing, thereby to break the base material.

In addition, if resins as described above are irradiated to electron beam or γ ray after being formed into a base material film, then active oxygen is generated in the base material film. Such active oxygen generated in the base material film may negatively affect a pressure-sensitive adhesive layer which will be subsequently formed. Specifically, the pressure-sensitive adhesive layer may vary in its adhesive properties, and in a worst case delamination may occur between the base material film and the pressure-sensitive adhesive layer, leading to a serious trouble.

Further, the irradiation to electron beam or γ ray may have to be performed after resins as described above are once formed into a film-like shape, and an additional process is thus required for the manufacturing process. Moreover, an apparatus for generating electron beam or γ ray may be expensive from industrial standpoint, thereby to increase the manufacturing cost compared to that of a standard base material film.

The present invention has been created in view of such problems, and objects of the present invention include providing a base material film for a dicing sheet, which is not required to be imparted with physical energy such as electron beam or γ ray, which can reduce dicing dust generated during dicing of a cut object, and which has an excellent expandability, and providing a dicing sheet which comprises such a base material film.

Means for Solving the Problem

In order to achieve the above objects, first, the present invention provides a base material film used for a dicing sheet, the dicing sheet comprising the base material film and a pressure-sensitive adhesive layer laminated on one surface of the base material film, the base material film comprising a single layer of resin film or multiple layers of resin films, at least the resin film in contact with the pressure-sensitive adhesive layer being formed from a resin composition containing ethylene-(meth)acrylic acid copolymer as a main constituent, the resin composition further containing 0.3 to 17.0 parts by mass of an epoxy compound based on 100 parts by mass of the ethylene-(meth)acrylic acid copolymer (Invention 1).

Here, the "dicing sheet" in the present invention includes a dicing/die bonding sheet, and also includes one which has another base material and pressure-sensitive adhesive layer for being attached thereto with a ring frame. Further, the concept of the "sheet" in the present invention includes the concept of a "tape".

According to the above invention (Invention 1), the resin film employs as a raw material a resin composition which contains ethylene-(meth)acrylic acid copolymer and a certain amount of epoxy compound, and it may thus be considered that (meth)acrylic acid in the ethylene-(meth)acrylic acid copolymer and epoxy group or glycidyl group of the epoxy compound react to form an appropriate cross-linked structure at the time of manufacturing the resin film, thereby reducing dicing dust to be generated during dicing. Therefore, dicing dust may effectively be suppressed from being generated during the dicing of a cut object without the necessity of any physical energy such as electron beam or γ ray. In addition, nonuse of such electron beam or γ ray allows an excellent expandability to be obtained.

In the above invention (Invention 1), it is preferred that the resin film in contact with the pressure-sensitive adhesive layer has a melt flow rate value within 0.5 to 4.0 g/10 min at temperature 190 degrees C. and load of 2.16 kgf (Invention 2).

In the above invention (Invention 1, 2), it is preferred that the epoxy compound has a bisphenol A skeleton (Invention 3).

In the above invention (Invention 1, 2, 3), it is preferred that the number average molecular weight of the epoxy resin is 800 or more (Invention 4).

Second, the present invention provides a dicing sheet comprising: the base material film for a dicing sheet (Invention 1, 2, 3, 4); and a pressure-sensitive adhesive layer laminated on one surface of the base material film (Invention 5).

Advantageous Effect of the Invention

The base material film for a dicing sheet and the dicing sheet according to the present invention allows for effectively suppressing dicing dust from being generated during the dicing of a cut object without the necessity of any physical energy such as electron beam or γ ray. That base material film for a dicing sheet and that dicing sheet do not require to be exposed to electron beam or γ ray, thus being free from problems such as decreased elasticity and strength, providing an excellent expandability, and not negatively affecting the pressure-sensitive adhesive layer.

BRIEF DESCRIPTION OF DRAWINGS

FIG. 1 is a cross-sectional view of a dicing sheet according to one embodiment of the present invention.

MODE FOR CARRYING OUT THE INVENTION

Hereinafter, embodiments of the present invention will be described.

FIG. 1 is a cross-sectional view of a dicing sheet according to one embodiment of the present invention. Note that the dicing sheet according to the present embodiment may be a dedicated one for use in a dicing process or a dicing/die bonding sheet for use in both the dicing process and a die bonding process.

As shown in FIG. 1, dicing sheet 1 according to the present embodiment comprises a base material film 2 and a pressure-sensitive adhesive layer 3 laminated on one surface (the upper surface in FIG. 1) of the base material film 2. It is preferred that a release sheet capable of being removed is optionally laminated on the exposed surface (the upper surface in FIG. 1) of the pressure-sensitive adhesive layer 3 in order to protect the pressure-sensitive adhesive layer 3. This dicing sheet 1 may take any form, such as tape-like or label-like form.

The base material film 2 comprises a single layer of resin film or multiple layers of resin films, and at least the resin film in contact with the pressure-sensitive adhesive layer 3 (in case of single layer, that resin film; in case of multiple layers, the resin film in contact with the pressure-sensitive adhesive layer 3) is formed from a resin composition which contains ethylene-(meth)acrylic acid copolymer as a main constituent and 0.3 to 17.0 parts by mass of an epoxy compound based on 100 parts by mass of the ethylene-(meth)acrylic acid copolymer.

The term "(meth)acrylic acid" used herein is intended to mean both acrylic acid and methacrylic acid. Accordingly, the "ethylene-(meth)acrylic acid copolymer" may be ethylene-acrylic acid copolymer, ethylene-methacrylic acid copolymer, or ethylene-acrylic acid-methacrylic acid copolymer.

The resin film in contact with the pressure-sensitive adhesive layer 3 employs as a raw material a resin composition which contains ethylene-(meth)acrylic acid copolymer and a certain amount of epoxy compound as described above, and it may thus be considered that (meth)acrylic acid in the ethylene-(meth)acrylic acid copolymer and epoxy group or glycidyl group of the epoxy compound react to form an appropriate cross-linked structure at the time of manufacturing the resin film, thereby reducing the dicing dust to be generated during the dicing. It is also considered that the ethylene component in the ethylene-(meth)acrylic acid copolymer imparts an excellent expandability to the resin film.

In the above ethylene-(meth)acrylic acid copolymer, structural units derived from acrylic acid and/or methacrylic acid may be contained in the copolymer preferably with the rate of 4% to 20% by mass, and more preferably with the rate of 5% to 12% by mass.

If the contained amount of (meth)acrylic acid in the ethylene-(meth)acrylic acid copolymer is less than 4% by mass, then the crystallinity of the resin film will be enhanced to cause the necking of the base material film 2 at the time of expanding after the dicing thereby possibly not contributing to uniform expandability. If, on the other hand, the contained amount of (meth)acrylic acid exceeds 20% by mass, then the base material film 2 itself may come to be sticky and the dicing sheet 1 may thus not be carried during the dicing by using an apparatus.

In the ethylene-(meth)acrylic acid copolymer, parts other than the structural units derived from acrylic acid and/or methacrylic acid are basically structural units derived from ethylene, but the ethylene-(meth)acrylic acid copolymer may also contain, if not detracting the objects of the dicing sheet 1 according to the present embodiment, other structural units derived from α-olefin, such as propylene, methyl(meth)acrylate, ethyl(meth)acrylate, alkyl vinyl ester, etc. Such structural units derived from other monomers may be contained in the above ethylene-(meth)acrylic acid copolymer with the rate of less than 10% by mass.

Copolymerization form of the ethylene-(meth)acrylic acid copolymer is, such as, but not limited to, any of random, block, or graft copolymerization form. Further, the molecular weight of the ethylene-(meth)acrylic acid copolymer is preferably 10,000 to 1,000,000 as weight average molecular weight (Mw), and more preferably 50,000 to 500,000.

Main component of the raw material resin composition for the resin film in contact with the pressure-sensitive adhesive layer 3 may be one type of ethylene-(meth)acrylic acid copolymer, or a blend of two or more types of ethylene-(meth)acrylic acid copolymers.

The raw material resin composition for the resin film in contact with the pressure-sensitive adhesive layer 3 contains epoxy compound, and the epoxy compound combined into the ethylene-(meth)acrylic acid copolymer as the main component may effectively reduce dicing dust to be generated during the dicing of a cut object such as a semiconductor wafer and a package.

The term "epoxy compound" used herein includes an epoxy resin.

The epoxy compound is enough if being a compound having an epoxy group in the molecule, but preferred is a compound having one or more epoxy groups, more preferred is a compound having two or more epoxy groups, and most preferred is a compound having two epoxy groups.

Examples of the epoxy compound having one or more epoxy groups include: glycidyl ethers of bisphenols such as bisphenol A, bisphenol F, bisphenol S, resorcinol, phenol novolak, and cresol novolak; glycidyl ethers of alcohols such as butanediol, polyethylene glycol, and polypropylene glycol; glycidyl ethers of carboxylic acids such as phthalic acid, isophthalic acid, and tetrahydrophthalic acid; glycidyl-type or alkylglycidyl-type epoxy compounds obtained by substituting an active hydrogen bonded to a nitrogen atom of aniline isocyanurate or the like with a glycidyl group; so-called alicyclic epoxy compounds obtained from a compound containing an alicyclic structure having a carbon to carbon double bond by oxidizing the double bond thereby to incorporate epoxy; bisphenyl-type epoxy resins, heterocyclic epoxy resins, glycidyl amine-type epoxy resins, glycidyl ester-type epoxy resins, hydantoin-type epoxy resins, isocyanurate-type epoxy resins, phosphorus-containing epoxy resins, stilbene-type epoxy resins, hydroquinone-type epoxy resins, naphthalene skeleton-type epoxy resins, tetraphenylol ethane-type epoxy resins, DPP (di-n-pentyl phthalate)-type epoxy resins, trishydroxy phenyl methane-type epoxy resins, dicyclopentadiene phenol type epoxy resins, silicon-containing epoxy resins, diglycidyl ethers of bisphenol A ethylene-oxide adducts, diglycidyl ethers of bisphenol A propylene oxide adducts, cyclohexane dimethanol diglycidyl ethers, polyglycidyl ethers of aliphatic polyalcohols, polyglycidyl esters of polybasic acids, and halides thereof (such as brominated epoxy resin) or epoxy resins such as nuclear hydrogenated compounds thereof. Each of these epoxy compounds may be used alone or two or more kinds may be used in combination.

Among the above, epoxy compounds are preferred to be ones each having a bisphenol A skeleton which has two epoxy groups. Specifically, preferred are bisphenol A-type epoxy resins, diglycidyl ethers of bisphenol A ethylene-oxide adducts, diglycidyl ethers of bisphenol A propylene oxide adducts, oligomer modified bisphenol A-type epoxy resins etc. Epoxy compounds having bisphenol A skeletons are remarkable in the effect of reducing dicing dust.

Lower limit of the number average molecular weight (Mn) of epoxy compounds is preferably 250, and more preferably 800. Upper limit of the Mn of epoxy compounds is preferably 5,000, and more preferably 4,000. If the Mn of epoxy compounds is less than 250, then the compounds will behave as a liquid and may cause fires during the film forming process thereby becoming difficult to be handled. In addition, film forming may become difficult to be well done because the number of functional groups per unit mass increases to progress gelatification during the film forming process. If, on the other hand, the Mn of epoxy compounds exceeds 5,000, then the dispersibility may deteriorate when the epoxy compounds are molten and kneaded with the ethylene-(meth) acrylic acid copolymer, thus negatively affecting the film forming ability. Note that the above number average molecular weight is a polystyrene equivalent value as measured by gel permeation chromatography (GPC) method.

The contained amount of epoxy compounds in the raw material resin composition for the resin film in contact with the pressure-sensitive adhesive layer 3 is within the range of 0.3 to 17.0 parts by mass based on 100 parts by mass of the ethylene-(meth)acrylic acid copolymer, and preferably 0.5 to 15.0 parts by mass. If the contained amount of epoxy resins is less than 0.3 parts by mass, then the advantageous effect of reducing dicing dust will not be obtained. If the contained amount of epoxy compounds exceeds 17.0 parts by mass, then the degree of cross-linkage will be excessive, and well-controlled film forming will be difficult.

The raw material resin composition for the resin film in contact with the pressure-sensitive adhesive layer 3 may contain, if not detracting the objects of the dicing sheet 1 according to the present embodiment, resins such as polyethylene, polypropylene, polymethylpentene, ethylene-vinyl acetate copolymer, ethylene-(meth)acrylic acid ester copolymers such as ethylene-methyl(meth)acrylate copolymer and ethylene-ethyl(meth)acrylate copolymer, ethylene-ionomer copolymer, ethylene-vinyl alcohol copolymer, and polybutene. Such resins other than ethylene-(meth)acrylic acid copolymer and epoxy compounds may be contained in the above raw material resin composition with the rate of less than 50% by mass.

The resin film in contact with the pressure-sensitive adhesive layer 3 may be manufactured in an ordinary method, such as, by kneading ethylene-(meth)acrylic acid copolymer and epoxy compounds possibly in combination with other resins to be contained if needed, and thereafter film forming through extrusion forming or other appropriate process directly from the kneaded material or indirectly via a production process for pellets. Epoxy compounds may be used in a form of master batch. It is preferred that the temperature during the kneading is 180 to 230 degrees C.

The resin film in contact with the pressure-sensitive adhesive layer 3 is preferably such that the melt flow rate (MFR) value in compliance with JIS K7210: 1999 is 0.5 to 4.0 g/10 min at the temperature of 190 degrees C. and the load of 2.16 kgf, and more preferably 1.0 to 2.5 g/10 min. The MFR within the above ranges allows the extrusion forming to form a resin film having uniform and well-controlled film thickness accuracy.

In the case where the base material film 2 comprises multiple layers of resin films, one or more resin films located not to be in contact with the pressure-sensitive adhesive layer 3 are not particularly limited so long as not detracting the functionality as the dicing sheet 1, and may be selected from various resin films. Examples of such resin films include, for example, polyolefin films such as polyethylene film, polypropylene film, and polybutene film; ethylene copolymer films such as ethylene-vinyl acetate copolymer film and ethylene-(meth)acrylic acid ester copolymer film; polyester films such as polyethylene terephthalate and polyethylene naphthalate films; polyurethane films; polyvinyl chloride films; and polyamide films. Ethylene-(meth)acrylic acid copolymer film may also be chosen.

The base material film 2 of multiple layers may be manufactured by co-extrusion or other appropriate methods for forming respective resin films while at the same time laminating them, or by forming respective resin films and thereafter laminating them by means of adhesive etc. Note that, when manufacturing the base material film 2 of multiple layers by co-extrusion, it is preferred that the one or more resin films not in contact with the pressure-sensitive adhesive layer 3 also have a similar MFR to the above MFR of the resin film in contact with the pressure-sensitive adhesive layer 3. If the resin film in contact with the pressure-sensitive adhesive layer 3 as well as the one or more resin films not in contact with the pressure-sensitive adhesive layer 3 have such an MFR, then significant lamination disorder may be suppressed in the thickness direction of the obtained base material film 2.

The thickness of the base material film 2 is ordinarily 40 to 500 μm, and preferably 60 to 200 μm. When employing the base material film 2 of multiple layers, the thickness of the resin film in contact with the pressure-sensitive adhesive layer 3 is ordinarily 40 μm or more, and preferably 60 μm or more, to the total thickness of the base material film 2. The depth where a dicing blade cut into the dicing sheet 1 is usually less than 40 μm, and therefore, if the resin film in contact with the pressure-sensitive adhesive layer 3 has the above thickness, then the dicing blade will not reach the other one or more resin layers, so that dicing dust may be prevented from generating in the other one or more resin layers.

The fracture elongation of the base material film 2 in the present embodiment is preferably 100% or more, and further preferably 200% or more. The base material film 2 having 100% or more of the fracture elongation is unlikely to fracture during the expanding process, and the chips formed by cutting the cut object will readily be separated.

In addition, it is preferred that the tensile elastic modulus of the base material film 2 in the present embodiment is 80 to 160 MPa. If the tensile elastic modulus is less than 80 MPa, then the dicing sheet 1 may become slack due to a soft base material film 2 thereof when a ring frame is fixed after a wafer is attached, thereby causing a carrying error. If, on the other hand, the tensile elastic modulus exceeds 160 MPa, then problems may occur that the dicing sheet 1 itself is peeled-off from the ring frame because the load applied during the expanding process increases.

Available examples of pressure-sensitive adhesive as a constituent of the pressure-sensitive adhesive layer 3 include ones to be ordinarily used for a dicing sheet, such as rubber-based, acrylic-based, epoxy-based, silicone-based, and polyvinyl ether-based adhesives as well as energy ray-curable adhesive (including ultraviolet-curable adhesive) and thermally curable adhesive. In addition, if the dicing sheet 1 according to the present embodiment is used as a dicing/die bonding sheet, then there may be used curable pressure sensitive adhesive, thermoplastic adhesive, B-stage adhesive, and other appropriate adhesives having both functions of wafer fixing and die bonding.

The thickness of the pressure-sensitive adhesive layer 3 may ordinarily be 3 to 100 μm, and preferably 5 to 80 μm.

The dicing sheet 1 as described above may be manufactured by an ordinary method. For example, the dicing sheet 1 may be manufactured by: preparing a coating agent which contains a pressure-sensitive adhesive as a constituent of the pressure-sensitive adhesive layer 3 and if needed further contains some solvent; applying the coating agent to one surface of the base material film 2 using a coater, such as roll coater, knife coater, roll knife coater, air knife coater, die coater, bar coater, gravure coater, and curtain coater; and drying it to form the pressure-sensitive adhesive layer 3. Alternatively, the dicing sheet 1 may also be manufactured by: applying the above coating agent to the release surface of an optional release film; drying it to form the pressure-sensitive adhesive layer 3; and thereafter pressing and attaching the base material film 2 onto the pressure-sensitive adhesive layer 3.

It is to be noted that the embodiments as heretofore explained are described to facilitate understanding of the present invention and are not described to limit the present invention. Therefore, it is intended that the elements disclosed in the above embodiments include all design variations and equivalents to fall within the technical scope of the present invention.

EXAMPLES

The present invention will hereinafter be more specifically described with reference to examples etc, but the scope of the present invention is not to be limited to these examples etc.

Example 1

Raw material for extrusion was obtained by melting and kneading at 210 degrees C. 100 parts by mass of ethylene-methacrylic acid copolymer (Nucrel N903H manufactured by DUPONT-MITSUI POLYCHEMICALS CO., LTD., content of methacrylic acid: 9% by mass) and 0.5 parts by mass of bifunctional bisphenol A-type epoxy resin with the Mn of 1,600 (Product name: jER 1055 manufactured by Japan Epoxy Resins Co. Ltd.) as an epoxy compound using a biaxial kneading machine (Labo-plastomill manufactured by Toyo Seiki Seisaku-sho, LTD). That raw material was subjected to extrusion forming using a compact T die extruder (Labo-plastomill manufactured by Toyo Seiki Seisaku-sho, LTD.) to provide a base material film of thickness 140 μm.

On the other hand, an energy ray-curable adhesive composition was obtained by mixing 100 parts by mass of copolymer (Mw: 500,000), derived from copolymerization of 95 parts by mass of n-butyl acrylate and 5 parts by mass of acrylic acid, 120 parts by mass of urethane acrylate oligomer (Mw: 8,000), 5 parts by mass of isocyanate-based curing agent (Coronate L manufactured by NIPPON POLYURETHANE INDUSTRY CO., LTD.), and 4 parts by mass of photopolymerization initiator (IRGACURE 184 manufactured by Ciba Specialty Chemicals Inc.).

The obtained energy ray-curable adhesive composition was applied to one surface of the above base material film so that the coating thickness after drying was 10 μm, and dried at 100 degrees C. during 1 min to form a pressure-sensitive adhesive layer thereby providing a dicing sheet.

Example 2

A dicing sheet was manufactured in a similar manner to Example 1 except for changing the contained amount of epoxy compound to 1.0 part by mass.

Example 3

A dicing sheet was manufactured in a similar manner to Example 1 except for changing the contained amount of epoxy compound to 15.0 parts by mass.

Example 4

A dicing sheet was manufactured in a similar manner to Example 1 except for using 1.0 part by mass of bifunctional bisphenol A-type epoxy compound with the Mn of 900 (Product name: jER 1001 manufactured by Japan Epoxy Resins Co. Ltd.) as the epoxy compound.

Example 5

A dicing sheet was manufactured in a similar manner to Example 1 except for using 1.0 part by mass of bifunctional bisphenol A-type epoxy compound with the Mn of 3,600 (Product name: jER 1009 manufactured by Japan Epoxy Resins Co. Ltd.) as the epoxy compound.

Example 6

A dicing sheet was manufactured in a similar manner to Example 5 except for changing the contained amount of epoxy compound to 0.5 parts by mass.

Example 7

A dicing sheet was manufactured in a similar manner to Example 5 except for changing the contained amount of epoxy compound to 15.0 parts by mass.

Example 8

A dicing sheet was manufactured in a similar manner to Example 1 except for using polyethylene glycol diglycidyl ether with the Mn of 310 (DENACOL EX-841 manufactured by Nagase ChemteX Corporation) 1.0 part by mass as the epoxy compound.

Example 9

A dicing sheet was manufactured in a similar manner to Example 1 except for using 1.0 part by mass of polypropylene glycol diglycidyl ether with the Mn of 940 (DENACOL EX-931 manufactured by Nagase ChemteX Corporation) as the epoxy compound.

Comparative Example 1

A dicing sheet was manufactured in a similar manner to Example 1 except for changing the contained amount of epoxy compound to 0.1 parts by mass.

Comparative Example 2

A dicing sheet was manufactured in a similar manner to Example 1 except for changing the contained amount of epoxy compound to 20.0 parts by mass.

Comparative Example 3

A dicing sheet was manufactured in a similar manner to Example 5 except for changing the contained amount of epoxy compound to 0.1 parts by mass.

Comparative Example 4

A dicing sheet was manufactured in a similar manner to Example 5 except for changing the contained amount of epoxy compound to 20.0 parts by mass.

Comparative Example 5

A dicing sheet was manufactured in a similar manner to Example 1 except for substituting the epoxy compound by 1.0 part by mass of polyethylene glycol (PEG) with the Mn of 310 (manufactured by TOKYO CHEMICAL INDUSTRY CO., LTD.).

Comparative Example 6

A dicing sheet was manufactured in a similar manner to Example 1 except for not containing the epoxy compound.

Exemplary Test 1

Measurements of Tensile Elastic Modulus and Fracture Elongation

Manufactured base material films in Examples and Comparative Examples were each cut into a test specimen of 15 mm×140 mm, and the tensile elastic modulus and the fracture elongation were measured in compliance with JIS K7161: 1994 and JIS K7127: 1999. Specifically, tensile test was performed for the above test specimen with the rate of 200 mm/min using a tensile tester (Autograph AG-IS 500N manufactured by SHIMADZU CORPORATION) after setting the distance between chucks as being 100 mm thereby to measure the tensile elastic modulus (MPa) and the fracture elongation (%). The tensile fracture strain was measured as the fracture elongation if the test specimen had no yield point, while the nominal tensile fracture strain was measured if the test specimen had a yield point. Results are shown in Table 1.

Exemplary Test 2

Expandability Test

After applying a 6-inch wafer to the pressure-sensitive adhesive layer of each dicing sheet manufactured in Examples and Comparative Examples, the dicing sheet was attached to a flat frame to fully cut the wafer into chips of 5 mm square using a diamond blade of 20 μm thickness. Thereafter, the dicing sheet was pulled down by 10 mm with the rate of 300 mm/min using an expanding jig (Die Bonder CSP-100VX manufactured by NEC Machinery Corporation). Determination was performed by visually checking the expanding condition of the entire wafer at that time. Results are shown in Table 1. In the table, "A" presents that the chips were uniformly aligned overall, "B" presents that one or more nonuniform areas existed, and "C" presents that the dicing sheet was broken.

Exemplary Test 3

Dicing Dust

After applying the pressure-sensitive adhesive layer of each dicing sheet manufactured in Examples and Comparative Examples to a BGA-type package module and then setting them on a dicing apparatus (AWD-4000B manufactured by TOKYO SEIMITSU CO., LTD.), dicing was performed under conditions as follows:
 work (adherend): BGA-type package module (KE-G1250) manufactured by KYOCERA Chemical Corporation);
 work size: 550 mm×440 mm, 1.55 mm thickness;
 dicing blade: Z1100LG2S3T1 manufactured by DISCO Corporation;
 blade rotating speed: 30,000 rpm;
 dicing speed: 100 mm/sec;
 cut-into depth: cutting into with the depth of 30 μm from the surface of the pressure-sensitive adhesive layer; and dicing size: 5 mm×5 mm.

Thereafter, the cut chips were removed after irradiating ultraviolet rays (160 mJ/cm$^2$) from the side of the base material film. Among lengthwise and breadthwise dicing lines, one lengthwise line and one breadthwise line located near the respective centers were subjected to the test where the number of string-like dust particles occurring on each line was counted using a digital microscope (VHX-100 manufactured by KEYENCE CORPORATION, magnification: ×100). "A" presents that the number of string-like dust particles was 0 to 10, "B" presents 11 to 20, and "C" presents 21 or more. Results are shown in Table 1.

Exemplary Test 5

Adhesion Change Over Time

Manufactured dicing sheets in Examples and Comparative Examples were each cut into 25 mm×250 mm to prepare a specimen. That specimen was attached to a #2000 silicon wafer and they were pressed to each other by reciprocating one time a rubber roll of 2 kg. After leaving in that status under the condition of 23 degrees C. and 50% RH during 20 min or more and then irradiating ultraviolet rays (160 mJ/cm$^2$) from the side of the base material film, 180 degrees peeling-off was performed with the rate of 300 mm/min using a universal tensile tester (Tensilon manufactured by ORIENTEC Co., LTD.) to measure the adhesion, the value thereof being f1.

On the other hand, after heating the dicing sheets under the condition of 70 degrees C. (in a constant-temperature oven of 70 degrees C.) during 48 hours and then letting them to cool to room temperature, each adhesion was measured in a similar method to the above adhesion, the measured value being f2. Both of those values were substituted into the following formula to calculate the rate of change: R (%) in the adhesion change over time. Results are shown in Table 1. If the R is 50% or less, then it can be determined that the added substances (epoxy compounds, PEG) do not affect the adhesion over time.

$$R=(f2-f1)\times 100/f1$$

Exemplary Test 6

MFR Measurement

Obtained base material films in Examples and Comparative Examples were each cut into 10 mm×10 mm to prepare a specimen (about 4 g). That specimen was subjected to the measurement of MFR (g/10 min) in compliance with JIS K7210: 1999 at the load of 2.16 kg and the test temperature of 190 degrees C. using a Flow Tester (CFT-100D manufactured by SHIMADZU CORPORATION). Results are shown in Table 1.

Exemplary Test 7

Film Formability

Appearances of the obtained base material films in Examples and Comparative Examples were visually checked. Evaluation is such that "A" presents a level where no large grain and no colored gel substance existed, "B" presents a level where large grains or colored gel substances existed, but no irregularity were perceived when touching, and "C" presents a level where irregularity was obviously generated. Results are shown in Table 1.

TABLE 1

|  |  | Example 1 | Example 2 | Example 3 | Example 4 | Example 5 | Example 6 | Example 7 | Example 8 |
|---|---|---|---|---|---|---|---|---|---|
| Tensile test | Tensile elastic modulus: [MPa] | 130 | 140 | 150 | 140 | 150 | 130 | 160 | 140 |
|  | Fracture elongation: [%] | 310 | 330 | 180 | 350 | 480 | 420 | 380 | 510 |
|  | Expandability | A | A | A | A | A | A | A | A |
|  | Dicing dust | A | A | A | A | A | A | A | B |
| Adhesion change over time: [%] |  | 37 | 35 | 30 | 29 | 38 | 39 | 34 | 33 |
| MFR: [g/10 min] |  | 2.0 | 2.0 | 1.1 | 1.2 | 2.7 | 2.8 | 2.5 | 1.1 |
| Film formability |  | A | A | A | A | A | A | A | A |

|  |  | Example 9 | Comparative Example 1 | Comparative Example 2 | Comparative Example 3 | Comparative Example 4 | Comparative Example 5 | Comparative Example 6 |
|---|---|---|---|---|---|---|---|---|
| Tensile test | Tensile elastic modulus: [MPa] | 150 | 130 | 180 | 130 | 150 | 130 | 130 |
|  | Fracture elongation: [%] | 480 | 420 | 90 | 430 | 210 | 420 | 410 |
|  | Expandability | A | A | B | A | B | A | A |
|  | Dicing dust | B | C | A | C | A | C | C |
| Adhesion change over time: [%] |  | 34 | 37 | 25 | 39 | 26 | −48 | 39 |
| MFR: [g/10 min] |  | 1.6 | 2.6 | 0.4 | 2.9 | 1.8 | 3.1 | 3 |
| Film formability |  | A | A | C | A | C | A | A |

As apparent from Table 1, according to the dicing sheets manufactured in Examples, there were few dicing dust particles. Moreover, the base material films obtained in Examples were well formed by extrusion forming and excellent in expandability.

INDUSTRIAL APPLICABILITY

The base material film for a dicing sheet and the dicing sheet according to the present invention can be preferably used for dicing of semiconductor wafers and various kinds of packages etc.

DESCRIPTION OF REFERENCE NUMERALS

1 . . . dicing sheet
2 . . . base material film
3 . . . pressure-sensitive adhesive layer

The invention claimed is:

1. A semiconductor wafer dicing sheet base material film having a surface configured to contact and to be laminated to a pressure-sensitive adhesive layer, the dicing sheet base material film comprising:
 a single layer of resin film or multiple layers of resin films, wherein
 at least the resin film configured to contact and be laminated to the pressure-sensitive adhesive layer is formed from a resin composition having a cross-linked structure and containing ethylene-(meth)acrylic acid copolymer as a main constituent and 0.3 to 17.0 parts by mass of an epoxy compound as a crosslinking agent based on 100 parts by mass of the ethylene-(meth)acrylic acid copolymer,
 the ethylene-(meth)acrylic acid copolymer excludes ethylene-ionomer copolymer,
 the number average molecular weight of the epoxy compound is 250 or more and 5,000 or less, and
 the semiconductor wafer dicing sheet base material film is configured to reduce generation of dust when attached to a semiconductor wafer during blade dicing of the semiconductor wafer.

2. The semiconductor wafer dicing sheet base material film according to claim 1, wherein the resin film has a melt flow rate value within 0.5 to 4.0 g/10 min at temperature 190 degrees C. and load of 2.16 kgf.

3. The semiconductor wafer dicing sheet base material film according to claim 2, wherein the epoxy compound has a bisphenol A skeleton.

4. The semiconductor wafer dicing sheet base material film according to claim 3, wherein the number average molecular weight of the epoxy compound is 800 or more and 5,000 or less.

5. A semiconductor wafer dicing sheet comprising:
 the semiconductor wafer dicing sheet base material film as set forth in claim 4; and
 a pressure-sensitive adhesive layer laminated on one surface of the semiconductor wafer dicing sheet base material film,
 wherein the semiconductor wafer dicing sheet reduces an amount of dust generated during dicing of a semiconductor wafer adhered to the semiconductor wafer dicing sheet with a resulting uniform alignment of diced chips, when compared to identical dicing of an identical semiconductor wafer adhered to another semiconductor wafer dicing sheet, and
 the another semiconductor wafer dicing sheet has an identical pressure-sensitive adhesive layer laminated on one surface of another semiconductor wafer dicing sheet base material film containing ingredients and amounts of ingredients identical to those in the semiconductor wafer dicing sheet base material film of the semiconductor wafer dicing sheet except for an amount of the epoxy compound being less than 0.3 or greater than 17.0 parts by mass based on 100 parts by mass of the ethylene-(meth)acrylic acid copolymer.

6. A semiconductor wafer dicing sheet comprising:
 the semiconductor wafer dicing sheet base material film as set forth in claim 3; and
 a pressure-sensitive adhesive layer laminated on one surface of the semiconductor wafer dicing sheet base material film,
 wherein the semiconductor wafer dicing sheet reduces an amount of dust generated during dicing of a semiconductor wafer adhered to the semiconductor wafer dicing sheet with a resulting uniform alignment of diced chips, when compared to identical dicing of an identical semiconductor wafer adhered to another semiconductor wafer dicing sheet, and
 the another semiconductor wafer dicing sheet has an identical pressure-sensitive adhesive layer laminated on one surface of another semiconductor wafer dicing sheet base material film containing ingredients and amounts of ingredients identical to those in the semiconductor wafer dicing sheet base material film of the semiconductor wafer dicing sheet except for an amount of the epoxy compound being less than 0.3 or greater than 17.0 parts by mass based on 100 parts by mass of the ethylene-(meth)acrylic acid copolymer.

7. The semiconductor wafer dicing sheet base material film according to claim 2, wherein the number average molecular weight of the epoxy compound is 800 or more and 5,000 or less.

8. A semiconductor wafer dicing sheet comprising:
 the semiconductor wafer dicing sheet base material film as set forth in claim 7; and
 a pressure-sensitive adhesive layer laminated on one surface of the semiconductor wafer dicing sheet base material film,
 wherein the semiconductor wafer dicing sheet reduces an amount of dust generated during dicing of a semiconductor wafer adhered to the semiconductor wafer dicing sheet with a resulting uniform alignment of diced chips, when compared to identical dicing of an identical semiconductor wafer adhered to another semiconductor wafer dicing sheet, and
 the another semiconductor wafer dicing sheet has an identical pressure-sensitive adhesive layer laminated on one surface of another semiconductor wafer dicing sheet base material film containing ingredients and amounts of ingredients identical to those in the semiconductor wafer dicing sheet base material film of the semiconductor wafer dicing sheet except for an amount of the epoxy compound being less than 0.3 or greater than 17.0 parts by mass based on 100 parts by mass of the ethylene-(meth)acrylic acid copolymer.

9. A semiconductor wafer dicing sheet comprising:
 the semiconductor wafer dicing sheet base material film as set forth in claim 2,
 wherein the semiconductor wafer dicing sheet reduces an amount of dust generated during dicing of a semiconductor wafer adhered to the semiconductor wafer dicing sheet with a resulting uniform alignment of diced chips, when compared to the dicing of an identical semiconductor wafer adhered to another semiconductor wafer dicing sheet, and the another semiconductor wafer dicing sheet has an identical pressure-sensitive adhesive layer laminated on one surface of another semiconductor wafer dicing sheet base material film containing ingredients and amounts of ingredients identical to those in the semiconductor wafer dicing sheet base material film of the semiconductor wafer dicing sheet except for an amount of the epoxy compound being less than 0.3 or greater than 17.0 parts by mass based on 100 parts by mass of the ethylene-(meth)acrylic acid copolymer.

10. The semiconductor wafer dicing sheet base material film according to claim 1, wherein the epoxy compound has a bisphenol A skeleton.

11. The semiconductor wafer dicing sheet base material film according to claim 10, wherein the number average molecular weight of the epoxy compound is 800 or more and 5,000 or less.

12. A semiconductor wafer dicing sheet comprising:
the semiconductor wafer dicing sheet base material film as set forth in claim 11; and
a pressure-sensitive adhesive layer laminated on one surface of the semiconductor wafer dicing sheet base material film,
wherein the semiconductor wafer dicing sheet reduces an amount of dust generated during dicing of a semiconductor wafer adhered to the semiconductor wafer dicing sheet with a resulting uniform alignment of diced chips, when compared to identical dicing of an identical semiconductor wafer adhered to another semiconductor wafer dicing sheet, and
the another semiconductor wafer dicing sheet has an identical pressure-sensitive adhesive layer laminated on one surface of another semiconductor wafer dicing sheet base material film containing ingredients and amounts of ingredients identical to those in the semiconductor wafer dicing sheet base material film of the semiconductor wafer dicing sheet except for an amount of the epoxy compound being less than 0.3 or greater than 17.0 parts by mass based on 100 parts by mass of the ethylene-(meth)acrylic acid copolymer.

13. A semiconductor wafer dicing sheet comprising:
the semiconductor wafer dicing sheet base material film as set forth in claim 10; and
a pressure-sensitive adhesive layer laminated on one surface of the semiconductor wafer dicing sheet base material film,
wherein the semiconductor wafer dicing sheet reduces an amount of dust generated during dicing of a semiconductor wafer adhered to the semiconductor wafer dicing sheet with a resulting uniform alignment of diced chips, when compared to identical dicing of an identical semiconductor wafer adhered to another semiconductor wafer dicing sheet, and
the another semiconductor wafer dicing sheet has an identical pressure-sensitive adhesive layer laminated on one surface of another semiconductor wafer dicing sheet base material film containing ingredients and amounts of ingredients identical to those in the semiconductor wafer dicing sheet base material film of the semiconductor wafer dicing sheet except for an amount of the epoxy compound being less than 0.3 or greater than 17.0 parts by mass based on 100 parts by mass of the ethylene-(meth)acrylic acid copolymer.

14. The semiconductor wafer dicing sheet base material film according to claim 1, wherein the number average molecular weight of the epoxy compound is 800 or more and 5,000 or less.

15. A semiconductor wafer dicing sheet comprising:
the semiconductor wafer dicing sheet base material film as set forth in claim 14; and
a pressure-sensitive adhesive layer laminated on one surface of the semiconductor wafer dicing sheet base material film,
wherein the semiconductor wafer dicing sheet reduces an amount of dust generated during dicing of a semiconductor wafer adhered to the semiconductor wafer dicing sheet with a resulting uniform alignment of diced chips, when compared to identical dicing of an identical semiconductor wafer adhered to another semiconductor wafer dicing sheet, and
the another semiconductor wafer dicing sheet has an identical pressure-sensitive adhesive layer laminated on one surface of another semiconductor wafer dicing sheet base material film containing ingredients and amounts of ingredients identical to those in the semiconductor wafer dicing sheet base material film of the semiconductor wafer dicing sheet except for an amount of the epoxy compound being less than 0.3 or greater than 17.0 parts by mass based on 100 parts by mass of the ethylene-(meth)acrylic acid copolymer.

16. A semiconductor wafer dicing sheet comprising:
the semiconductor wafer dicing sheet base material film as set forth in claim 1; and a pressure-sensitive adhesive layer laminated on one surface of the semiconductor wafer dicing sheet base material film.

17. The semiconductor wafer dicing sheet according to claim 16,
wherein the semiconductor wafer dicing sheet reduces an amount of dust generated during dicing of a semiconductor wafer adhered to the semiconductor wafer dicing sheet with an uniform alignment of diced chips, when compared to identical dicing of an identical semiconductor wafer adhered to another semiconductor wafer dicing sheet, and
the another semiconductor wafer dicing sheet has an identical pressure-sensitive adhesive layer laminated on one surface of another semiconductor wafer dicing sheet base material film containing ingredients and amounts of ingredients identical to those in the semiconductor wafer dicing sheet base material film of the semiconductor wafer dicing sheet except for an amount of the epoxy compound being less than 0.3 or greater than 17.0 parts by mass based on 100 parts by mass of the ethylene-(meth)acrylic acid copolymer.

18. The semiconductor wafer dicing sheet according to claim 16, wherein the number average molecular weight of the epoxy compound is 800 or more and 5,000 or less.

19. The semiconductor wafer dicing sheet according to claim 16, wherein the resin has a melt flow rate value within 0.5 to 4.0 g/10 min at temperature 190 degrees C. and load of 2.16 kgf.

20. A semiconductor wafer dicing sheet assembly, comprising:
a semiconductor wafer dicing sheet base material film formed from a resin composition having a cross-linked structure and containing ethylene-(meth)acrylic acid copolymer as a main and 0.3 to 17.0 parts by mass of an epoxy compound as a crosslinking agent based on 100 parts by mass of the ethylene-(meth)acrylic acid copolymer;

a pressure-sensitive adhesive layer being laminated on one surface of the semiconductor wafer dicing sheet base material film for forming a semiconductor wafer dicing sheet; and a semiconductor wafer adhered to the pressure-sensitive adhesive layer, wherein the number average molecular weight of the epoxy compound is 250 or more and 5,000 or less, and the semiconductor wafer dicing sheet assembly is configured to reduce generation of dust when attached to a semiconductor wafer during blade dicing of the semiconductor wafer.

\* \* \* \* \*